United States Patent
Lesea et al.

(10) Patent No.: US 6,369,608 B1
(45) Date of Patent: Apr. 9, 2002

(54) CONDITIONING SEMICONDUCTOR-ON-INSULATOR TRANSISTORS FOR PROGRAMMABLE LOGIC DEVICES

(75) Inventors: Austin H. Lesea, Los Gatos, CA (US); Robert J. Francis, Toronto (CA)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/765,683

(22) Filed: Jan. 18, 2001

(51) Int. Cl.[7] .................................... H03K 19/177
(52) U.S. Cl. ............................. 326/39; 326/38; 326/44; 326/49
(58) Field of Search ................. 326/37–41, 44, 326/45, 49, 50

(56) References Cited

U.S. PATENT DOCUMENTS

| | | |
|---|---|---|
| 4,642,487 A | 2/1987 | Carter |
| 4,835,418 A | 5/1989 | Hsieh |
| 4,855,619 A | 8/1989 | Hsieh et al. |
| RE34,363 E | 8/1993 | Freeman |
| RE34,444 E | 11/1993 | Kaplinsky |
| 5,349,250 A | 9/1994 | New |
| 5,499,192 A | 3/1996 | Knapp et al. |
| 5,682,107 A | 10/1997 | Tavana et al. |
| 5,790,479 A | 8/1998 | Conn |
| 5,914,616 A | 6/1999 | Young et al. |
| 6,075,418 A | 6/2000 | Kingsley et al. |
| 6,208,164 B1 * | 3/2001 | Noble et al. .................. 326/41 |
| 6,239,616 B1 * | 5/2001 | Churcher et al. ............. 326/49 |
| 6,275,077 B1 * | 8/2001 | Tobin et al. .................. 326/82 |

* cited by examiner

*Primary Examiner*—Michael Tokar
*Assistant Examiner*—Don Phu Le
(74) *Attorney, Agent, or Firm*—W. Eric Webostad; Edel M. Young

(57) ABSTRACT

Method and apparatus for preconditioning and in-use conditioning of transistors formed on a semiconductor-on-insulator structure is described. More particularly, transistors of a programmable logic device (PLD), such as a field programmable gate array (FPGA), are preconditioned to take advantage of charge accumulation owing to a "floating body" effect. This preconditioning takes a form of switching transistors on and off prior to customer operation. Accordingly, semiconductor-on-insulator transistors accumulate charge during this switching period, so when customer operation takes place, transistor switching times are less variable over a period of operation of the PLD. Additionally, a design process and implementation is described for identification and in-use conditioning of transistors that may need conditioning during customer operation to control switching time variability.

29 Claims, 6 Drawing Sheets

CONDITIONING SEMICONDUCTOR-ON-INSULATOR TRANSISTORS FOR PROGRAMMABLE LOGIC DEVICES

FIELD OF THE INVENTION

This invention relates generally to conditioning transistors, and more particularly to conditioning semiconductor-on-insulator transistors in programmable logic devices.

BACKGROUND OF THE INVENTION

Programmable logic devices (PLDs) are a well-known type of a programmable integrated circuit. These devices may be programmed by a user to perform specified functions. Examples of PLDs are field-programmable gate arrays (FPGAs), programmable logic arrays (PLAs) and programmable array logic devices (PALs).

An FPGA comprises an array of configurable logic blocks (CLBs), input/output blocks (IOBs), and a programmable interconnect network. The FPGA conventionally comprises configuration memory cells for configuring the CLBS, IOBS, and interconnect. CLBs are connectable to one another and to IOBs through the programmable interconnect network. By connectable it is meant to include coupled through one or more circuit elements employed for coupling circuit elements to one another, including without limitation circuit elements used for buffering signals. More information on PLD architectures may be found in U.S. Pat. No. Re. 34,444, reissued Nov. 16, 1993 to Kaplinsky (deceased), U.S. Pat. No. Re. 34,363, reissued Aug. 31, 1993 to Freeman (deceased), U.S. Pat. No. 4,642,487, issued Feb. 10, 1987 to Carter, and U.S. Pat. No. 5,914,616 issued Jun. 22, 1999 to Young et al.

CLBs are configured to provide one or more logic functions, including, but not limited to, an AND gate, a NAND gate, an OR gate, an exclusive OR gate, a NOR gate, an exclusive NOR gate, an inverter, a latch, a flip-flop, and combinations thereof to provide functional elements. In particular, CLBs are configured by control signals supplied to control logic. More information on CLB configurable functions may be found in U.S. Pat. No. 5,349,250, issued Sep. 20, 1994 to New.

The programmable interconnect network comprises programmable interconnection points (PIPs) for configuring connections between a plurality of conductive interconnect lines. These conductive interconnect linesmay be of varying lengths. Shorter length lines are called "single length lines" or "singles," (a single length line spans a single CLB) or "doubles" (spans two CLBs). Somewhat longer intermediate-length lines include "hex lines" or "hexes," (spans six CLBs) and longer lengths lines "long lines" span 12 CLBs, half a column, or a whole column (or row). More information on such an interconnect line length hierarchy may be found in U.S. Pat. No. 5,914,616, issued Jun. 22, 1999 to Young et al.

Owing to resistive-capacitive (RC) time delays of doubles, hexes and long lines, these types of lines are conventionally buffered. Buffering amplifies a passing signal. More information on buffered routing may be found in U.S. Pat. No. 4,855,619 issued Aug. 8, 1989 to Hsieh et al. and U.S. Pat. No. 4,835,418 issued May 30, 1989 to Hsieh.

Accordingly, the FPGA may be used to implement a circuit design. To configure an FPGA to implement a circuit design, configuration data is loaded into the configuration memory cells internal to the FPGA. This configuration data selects functions performed by the CLBs, determines whether the IOBs are used for input, output, or both and establishes slew rate and other characteristics for interfacing with external devices. Configuration data may also provide information regarding circuit operation, such as timing requirements, initial conditions, and other circuit operation information. Conventionally, configuration data is supplied as a bitstream converted from a circuit definition language, such as Verilog, VHDL, or other circuit simulation language. More information on high-level circuit design may be found in U.S. Pat. No. 5,499,192, issued Mar. 12, 1996 to Knapp et al.

FPGAs may be manufactured using a semiconductor-on-insulator, or more particularly a silicon-on-insulator (SOI), structure. Conventionally, an SOI structure comprises two slices of single crystalline silicon separated by silicon oxide.

SOI transistors have what has been termed a "floating body," namely, an electrically floating semiconductor portion. Charge, having little opportunity to dissipate, can accumulate on the "floating body." This accumulated charge affects switching speed of SOI transistors. For example, initial or unbiased operation of an SOI transistor may be slower than subsequent or biased operation of the same SOI transistor owing to charge build-up. Thus, SOI transistor delay is operationally variable. To exacerbate the variability of SOI transistor delay, charge may leak-off the floating body between switching events. This variability makes accurate modeling to account for SOI transistor delay in circuit designs problematic.

Conventionally, FPGAs come with "speed files." "Speed files" contain information used to predict delays in an FPGA. These delays are in turn used to predict signal propagation times for a circuit design implemented in the FPGA. Worst-case delay values may be used to ensure the implemented circuit design will work in accordance with specified parameters. More information on determining timing characteristics may be found in U.S. Pat. No. 5,790,479 issued Aug. 4, 1998 to Conn and U.S. Pat. No. 6,075,418 issued Jun. 13, 2000 to Kingsley et al. However, operation of an SOI transistor may be considerably faster than an equivalent non-SOI transistor, so guaranteeing worst-case values may lead to substantially less than optimal designs.

Therefore, a need exists in the art for a PLD with operationally less variability of SOI transistor switching speed.

SUMMARY OF THE INVENTION

An aspect of the present invention is a method for preconditioning at least one transistor in a programmable logic device formed on a semiconductor-on-insulator structure. More particularly, configuration data is loaded into the programmable logic device. The programmable logic device is configured in response to the configuration data, and the at least one transistor to be preconditioned is identified by the configuring of the programmable logic device. To precondition the at least one transistor, the at least one transistor is switched between on and off states for accumulating charge.

Advantageously, by preconditioning a programmable logic device, switching speeds of transistors are increased, particularly for initial operation thereof. Accordingly, design rules using these faster switching speeds may be used. Moreover, not all transistors in a programmable logic device need to be preconditioned, saving both power and time. That is, preconditioning is limited to those transistors associated with logic nodes in use, as identified by configuration data.

The above, as well as additional aspects of the present invention, will become apparent in the following detailed written description.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
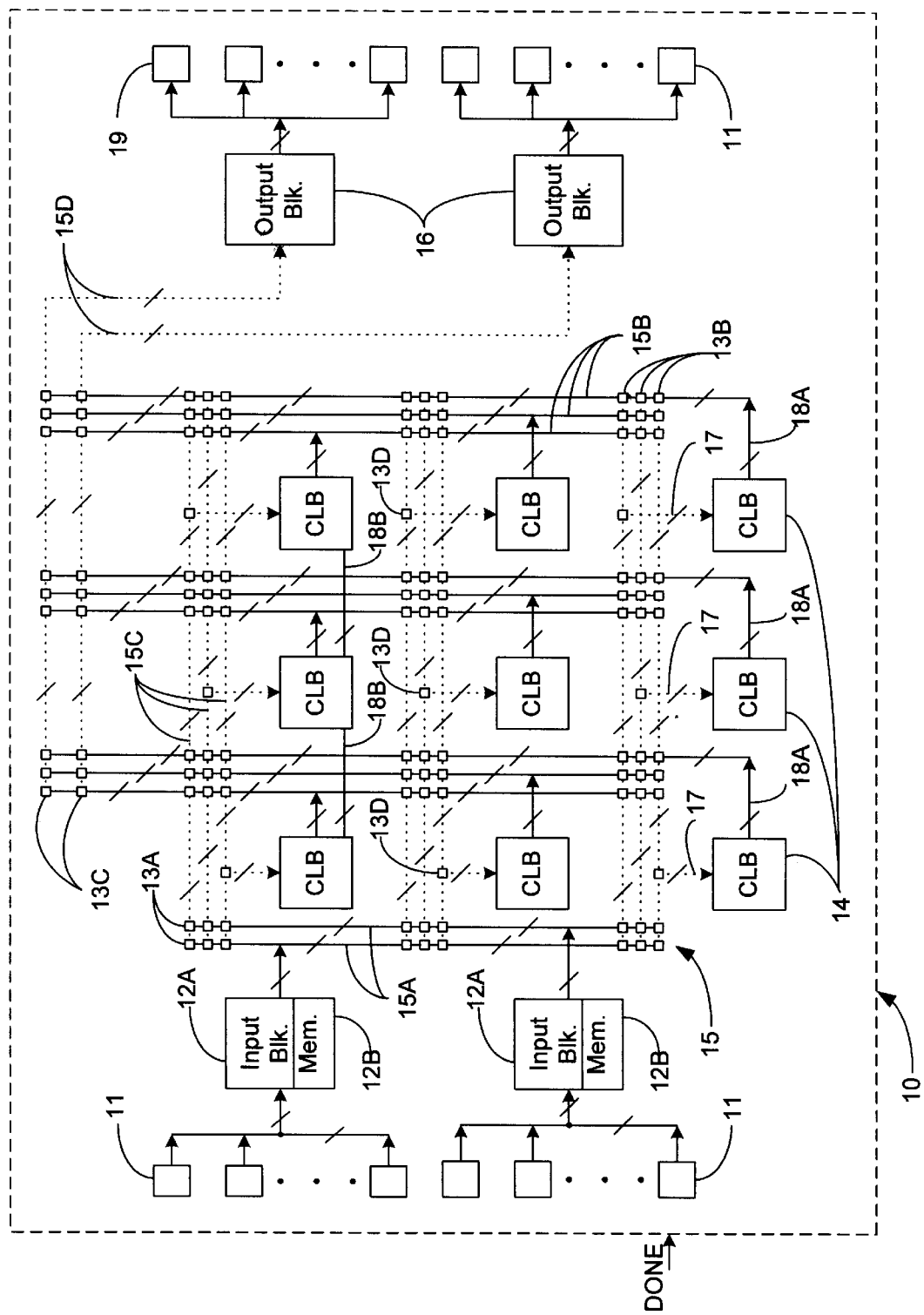
FIG. 1 is a schematic diagram depicting an exemplary portion of an embodiment of a configured FPGA in accordance with an aspect of the present invention.

In FIG. 1, there is shown a schematic diagram depicting an exemplary portion of an embodiment of an FPGA 10 after configuring memory 12B in accordance with an aspect of the present invention. FPGA 10 comprises pads 11, input logic blocks 12A, memory 12B, an array of CLBs 14, interconnect network 15, and output logic blocks 16, and pads 19. Notably, pads 11 and 19 may function as either input or output pads. Examples of such I/O pads may be found in U.S. Pat. No. 5,682,107. However, for purposes of clarity, it shall be assumed that pads 11 have been configured for input, and that pads 19 have been configured for output.

Input pads 11 are operatively coupled to input logic blocks 12A and memory 12B. For clarity, memory 12B is illustratively shown broken-up or allocated to respective input logic blocks; however, memory 12B may be a separate block. Input logic blocks 12A and memory 12B are operatively coupled to input buses 15A of interconnect network 15.

Interconnect network 15 comprises input buses 15A, interconnect lines 15C, output buses 15B, output lines 15D, CLB input lines 17, CLB output lines 18A, CLB direct connect lines 18B, input PIPs 13A, CLB input PIPs 13D, CLB output PIPs 13B, and CLB array output PIPs 13C. To convey that lines are selectable as interconnects by programming PIPs, dashed lines are used.

Input buses 15A are programmably connectable to interconnect lines 15C via input PIPs 13A. Interconnect lines 15C are programmably connectable to CLB input lines 17 via CLB input PIPs 13D. CLBs 14 may be directly connect to one another via CLB direct connect lines 18B, which conventionally are unbuffered "singles," or directly connected or programmably connectable (not shown) to output buses 15B via CLB output lines 18A and then programmably connectable to interconnect lines 15C via CLB output PIPs 13B.

Output buses 15B are programmably connectable to output lines 15D via CLB array output PIPs 13C. Output lines 15D are programmably connectable to output logic blocks 16, which are operatively coupled to output pads 19.

FPGA 10 is an example of a FPGA architecture in which one or more aspects of the present invention may be implemented. However, one or more aspects of the present invention may be used in other FPGA architectures, including the Virtex, Spartan, XC4000, and XC9500 architectures, all of which are available from Xilinx, Inc. of San Jose, Calif. In order to more clearly describe aspects of the present invention, well-known details regarding FPGAs are not described herein.

Figure 1A:
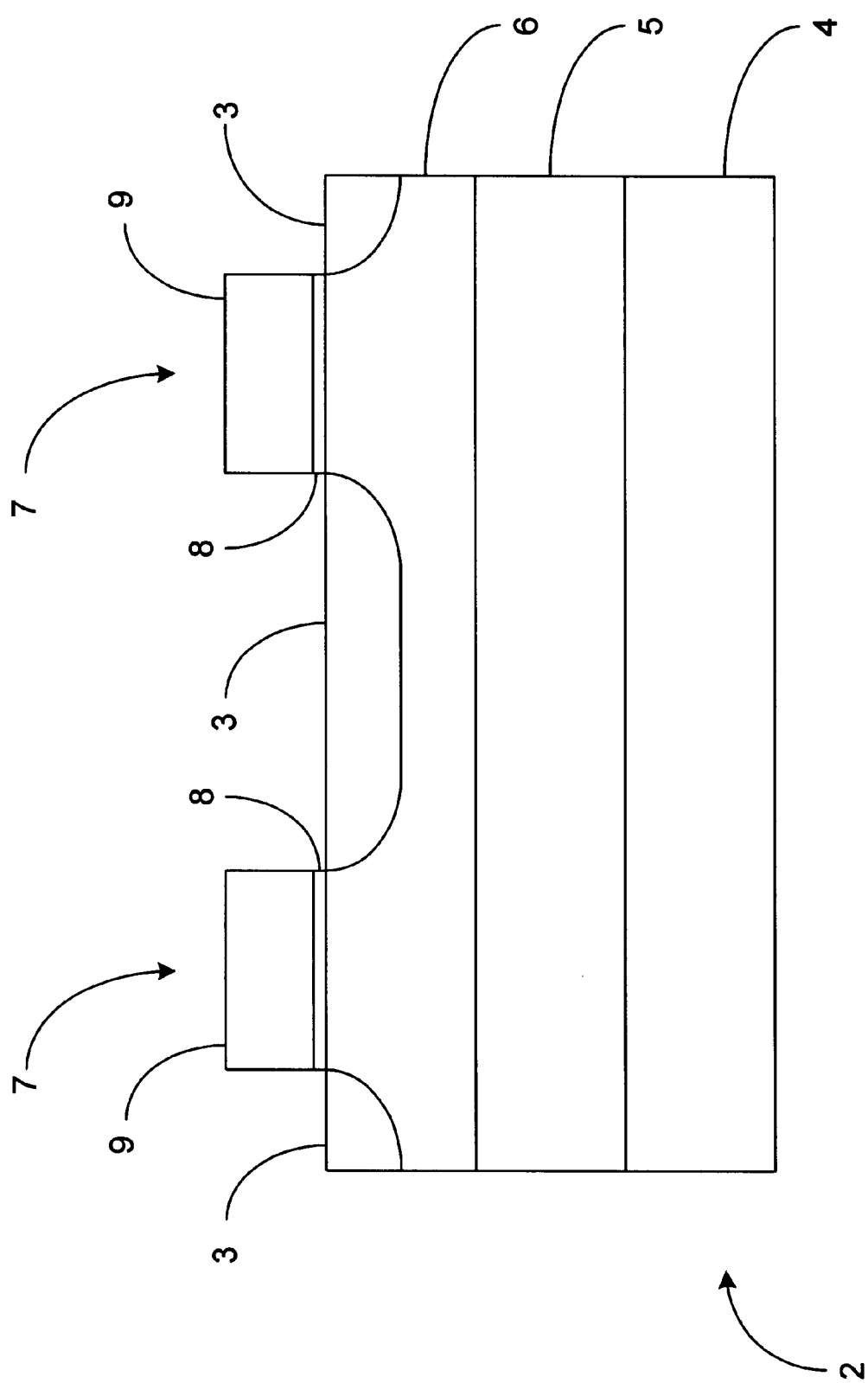
FIG. 1A depicts a cross-sectional view of two transistors formed in a semiconductor-on-insulator structure.

In accordance with an aspect of the present invention, FPGA 10 is formed at least in part using a semiconductor-on-insulator structure. FIG. 1A depicts a cross-sectional view of two transistors 7 formed with semiconductor-on-insulator structure 2. Transistors 7 comprise wells 3, gate dielectrics 8 and conductive gates 9. Wells 3 are formed in semiconductor layer 6 of semiconductor-on-insulator structure 2.

Semiconductor-on-insulator structure 2 comprises a first semiconductor layer 4, at least one insulator layer 5, and a second semiconductor layer 6. Conventionally, semiconductor layers 4 and 6 are slices of single crystalline silicon. Conventionally, insulator layer 5 is a silicon oxide, and more particularly a single layer of a silicon oxide. However, insulator layer 5 may comprise a plurality of sublayers. Insulator layer 5 being a dielectric at least substantially reduces electrical conduction between layers 4 and 6. Thus, charge applied to layer 6 tends to stay away from layer 4 subject to leakage rates. Conventionally, leakage rates for SOI structures are temperature dependent, though at normal operating temperatures leakage rates tend to be approximately in a 1 to 100 millivolt per second range. Accordingly, if an FPGA operates at a clock frequency substantially higher than approximately 1000 Hertz, leakage may be negligible.

FPGA 10 comprises four modes of operation, namely, cleanout mode, programming or configuration mode, precondition mode, and normal or customer operation mode. A cleanout mode is to initialize FPGA 10 interconnect network 15 to a known starting state. Conventionally, a cleanout operation sets the entire interconnect network 15 to a logic high (1) state to mitigate unwanted electrical currents from flowing during a configuration mode. Configuration mode comprises providing a bitstream representing configuration data to FPGA 10 to configure configuration memory cells of FPGA 10. Precondition mode, described in more detail elsewhere herein, conditions one or more transistors of FPGA 10 prior to each initial customer operation mode.

Customer operation mode is used to carry out a programmed function or functions corresponding to configuration data provided to FPGA 10.

Figure 2:
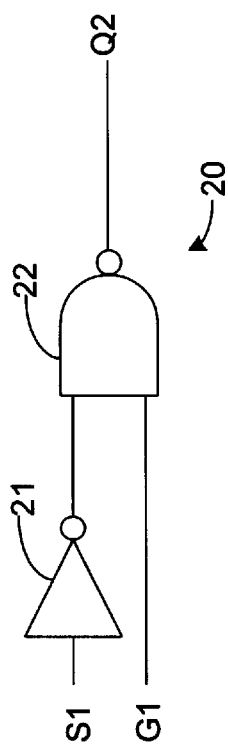
FIG. 2 is a schematic diagram depicting an exemplary embodiment of a prior art FPGA mode select circuit for buffered stages.

Referring to FIG. 2, there is shown a schematic diagram depicting an exemplary embodiment of a prior art FPGA mode select circuit 20. Mode select circuit 20 conventionally forms a portion of input logic block 12A (shown in FIG. 1). A first global signal (G1), when logic low, forces output Q2 of NAND gate 22 high. Output Q2 can connect to interconnect network 15 (shown in FIG. 1). Input signal (S1) is supplied to inverter 21, and S1's complement is supplied to NAND gate 22. S1 is any signal to interconnect network 15 (shown in FIG. 1).

Figure 3:
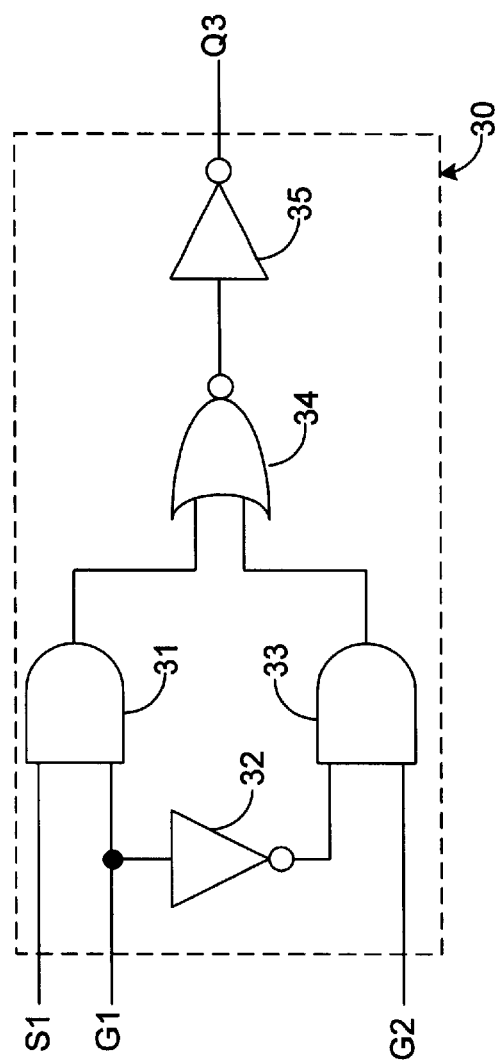
FIG. 3 is a schematic diagram depicting an exemplary embodiment of a FPGA mode select circuit for buffered stages in accordance with an aspect of the present invention.

However, to implement preconditioning in accordance with an aspect of the present invention, mode select circuit 20 may be replaced with mode select circuit 30 of FIG. 3 and output signal Q3 may be toggled in order to increase the switching speed of any circuit driven by output signal Q3. Referring to FIG. 3, there is shown a schematic diagram depicting an exemplary embodiment of an FPGA mode select circuit 30 for buffered stages in accordance with an aspect of the present invention. Mode select circuit 30 may form a portion of input logic block 12A.

When G1 and a second global signal (G2) are logic high, FPGA 10 is in a normal operational mode. G1's complement from output of invert 32 is logic low, and output from AND gate 33 is a logic low input to NOR gate 34. When S1 is asserted, namely logic high, output of AND gate 31 is logic high, and so output of NOR gate 34 is logic low. Inverter 35 inverts or complements this logic low output to provide an output signal (Q3) to interconnect network 15. Accordingly, in this mode Q3 will track or follow S1.

When G1 and G2 are held logic low, FPGA 10 is in a cleanout mode. AND gates 31 and 33 have logic low outputs, so output of NOR gate 34 is logic high. Thus, Q3 is logic low.

When G1 is held logic low and G2 is toggled, namely from logic low to logic high and from logic high to logic low, FPGA 10 is in a precondition mode. Because G1 is held logic low, output of inverter 32 is held logic high and output from AND gate 31 is logic low. When G2 is logic high, output from AND gate 33 is logic high. So output from NOR gate 34 is logic low. This logic low output is provided to inverter 35, and Q3 is logic high. When G2 is logic low, output from AND gate 33 is logic low. So output from NOR gate 34 is logic high. This logic high output is provided to inverter 35, and Q3 is logic low. Accordingly, it should be understood that Q3 tracks with toggling of G2 in this mode.

Figure 4:
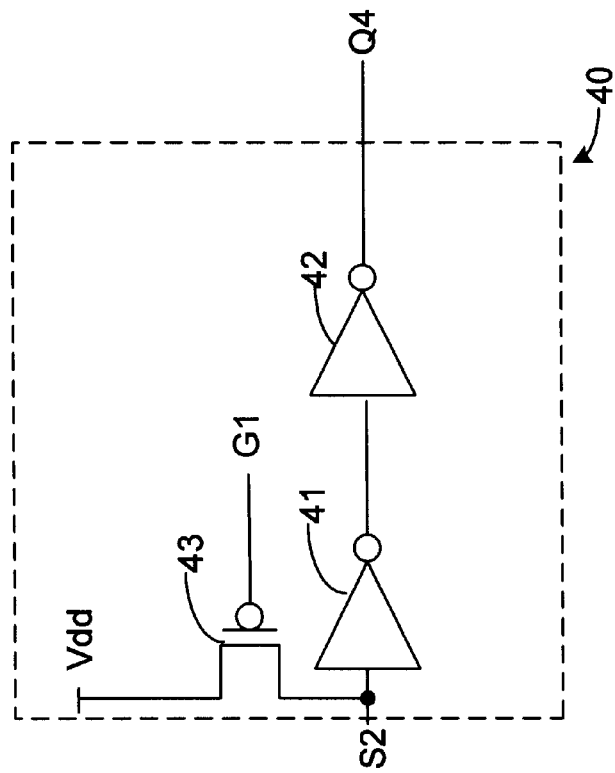
FIG. 4 is a schematic diagram depicting an exemplary embodiment of a prior art FPGA mode select circuit for unbuffered stages.

Notably, direct connects from one CLB 14 to another CLEB 14, for example direct connects 18B, may or may not be buffered. If they are not buffered, then signal S2 was buffered by mode select circuit 40 (shown in FIG. 4) of the prior art. FIG. 4 is a schematic diagram depicting an exemplary embodiment of a prior art FPGA mode select circuit 40. Signal S2 is any signal provided on an unbuffered direct path in interconnect network 15. Signal S2 is provided to inverter 41. When G1 is logic high, p-channel transistor is not switched, in order to keep from pulling up S2 to approximately Vdd, namely a supply voltage level. When G1 is logic high, S2 tracks with output Q4 of inverter 42. Accordingly, FPGA 10 is in customer mode when G1 is logic high. When G1 is logic low, p-channel transistor 43 is switched, and thus S2 is pulled up to approximately Vdd. Thus, Q4 is logic low, and FPGA 10 is in a cleanout mode.

Figure 5:
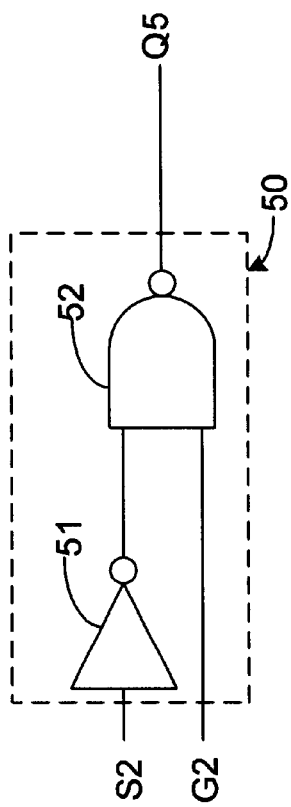
FIG. 5 is a schematic diagram depicting an exemplary embodiment of a FPGA mode select circuit for unbuffered stages in accordance with an aspect of the present invention.

However, to implement preconditioning in accordance with an aspect of the present invention, mode select circuit 40 may be replaced with mode select circuit 50 of FIG. 5. Referring to FIG. 5, there is shown a schematic diagram depicting an exemplary embodiment of an FPGA mode select circuit 50 for unbuffered stages in accordance with an aspect of the present invention. Circuits 50 may form portions of CLBs 14. As mentioned above, signal S2 is unbuffered.

When G2 is logic high and S2 is logic high, output Q5 of NAND gate 52 is logic high, as S2 is inverted by inverter 51 prior to inputting to NAND gate 52. When G2 is logic high and S2 is logic low, output Q5 of NAND gate 52 is logic low, as S2 is inverted by inverter 51 prior to inputting to NAND gate 52. Accordingly, when G2 is logic high, Q5 follows S2 as FPGA 10 is in customer operation mode. When G2 is logic low, then Q5 is logic high and FPGA 10 is in cleanout mode. When G2 is toggled between logic high and logic low and S2 is held logic low, Q5 follows G2 and FPGA 10 is in precondition mode.

Notably, there may be less frequently used circuits in a deployed design where preconditioning is not sufficient. Some signals are static for long periods. By long periods, it is meant in excess of approximately a millisecond with respect to SOI transistors. During a period of time without a transition, charge from preconditioning may leak off, thus slowing transistor performance. FIG. 6A is a block diagram depicting an exemplary portion of a pre-configuration process 65 in accordance with an aspect of the present invention. During a design process, at step 66 a designer identifies those logic nodes having one or more transistors that may not transition frequently enough and thus need conditioning during customer mode. It should be understood that a designer of a PLD may designate logic nodes having one or more transistors, instead of identifying individual transistors, for configuring such a PLD. Accordingly, by identifying a logic node for additional conditioning, one or more transistors associated with such a logic node are likewise identified for such in-use conditioning.

After identifying one or more logic nodes or transistors potentially needing additional conditioning during customer mode, at step 67 a conditioning circuit 60 (shown in FIG. 6B) is added to the design to condition at least one transistor or logic node identified at step 66.

Accordingly, one or more added conditioning circuits at step 67 form a portion of a design. This design may then be converted to a bitstream, as mentioned above, for programming an FPGA. Accordingly, added conditioning circuits are represented as a portion of configuration data provided to configure FPGA 10.

Figure 6B:
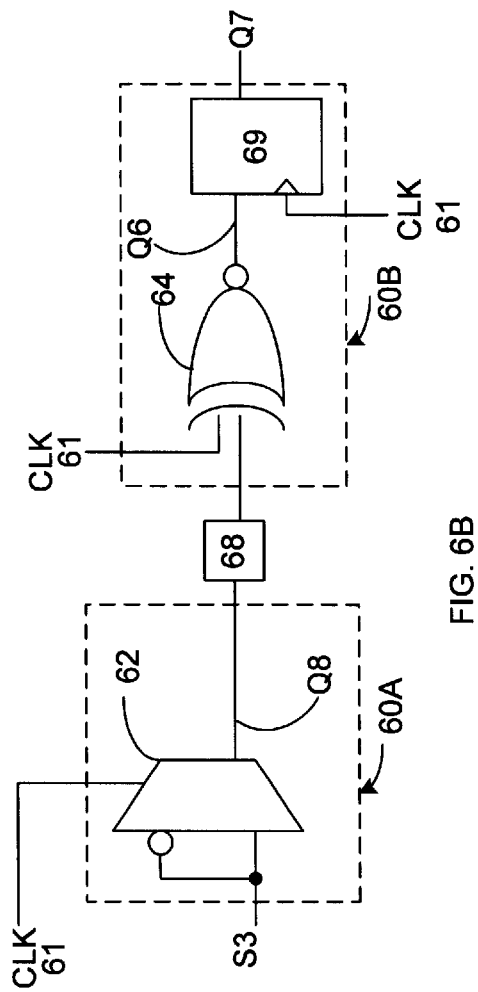
FIG. 6B is a schematic diagram depicting an exemplary embodiment of a FPGA conditioning circuit in accordance with an aspect of the present invention.
Figure 6A:
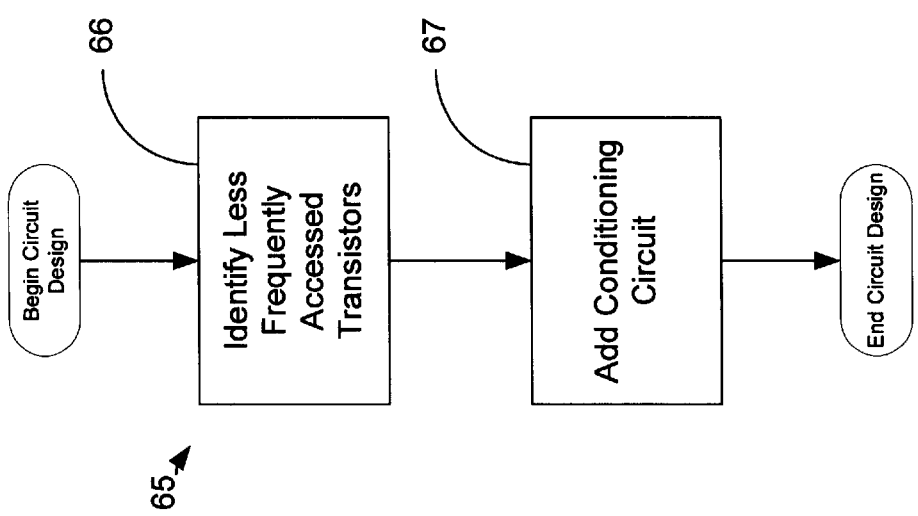
FIG. 6A is a block diagram depicting an exemplary portion of a pre-configuration process in accordance with an aspect of the present invention.

FIG. 6B is a schematic diagram depicting an exemplary embodiment of FPGA conditioning circuit portions 60A and 60B in accordance with an aspect of the present invention. In this embodiment, a clock (CLK) signal 61, which may be a global or system clock signal, is provided either directly to conditioning circuit portion 60A or from a clock multiplier or divider (not shown) to increase or decrease clock frequency.

Slow data signal S3 is a switching signal to be provided to a logic node or transistor targeted for conditioning during customer mode operation. S3 and its complement are provided to multiplexer (MUX) 62 as a selectable input signal. CLK signal 61 is provide to MUX 62 as a select signal. In this embodiment, output signal Q8 from MUX 62 when signal S3 is logic low, is a toggling signal approximately 180 degrees out-of-phase with CLB signal 61, and output signal Q8 from MUX 62 when signal S3 is logic high, is a toggling signal approximately in-phase with CLK signal 61. Notably, the above-mentioned convention may be reversed, namely output signal Q8 may be approximately in-phase with CLK signal 61 when signal S3 is logic high and approximately out-of-phase with CLK signal 61 when signal S3 is logic low. Moreover, MUX 62 may be replaced with an exclusive NOR (XNOR) gate. Conditioning circuit portion 60A is operatively coupled to conditioning circuit portion 60B via a portion 68 of interconnect network 15. Conditioning circuit portions may be implemented in CLBs 14.

Output signal Q8 is provided to conditioning circuit portion 60B via interconnect portion 68. Output signal Q8 and CLK signal 61 are provided as inputs to XNOR gate 64. When Q8 is approximately 180 degrees out-of-phase with CLK signal 61, output signal Q6 is logic low, possibly with some spiking owing to edges of signals Q8 and 61 slightly leading or lagging one another. When Q8 is approximately in-phase with CLK signal 61, output signal Q6 is logic high, possibly with some spiking owing to edges of signals Q8 and 61 slightly leading or lagging one another.

Because CLKs may only be approximately in-phase or 180 degrees out-of-phase, Q6 may have spiking where input edges are not aligned. Accordingly, a flip-flop 69 may be coupled to receive output signal Q6 and clocked by CLK signal 61 to remove spikes from output signal Q6, namely, output signal Q7 is output signal Q6 without spikes from misaligned edges. Notably, because output signal Q7 is a slow transitioning signal, additional instances of of conditioning circuits, such as conditioning circuit portions 60A and 60B may be added to further condition output signal Q7.

Figure 7:
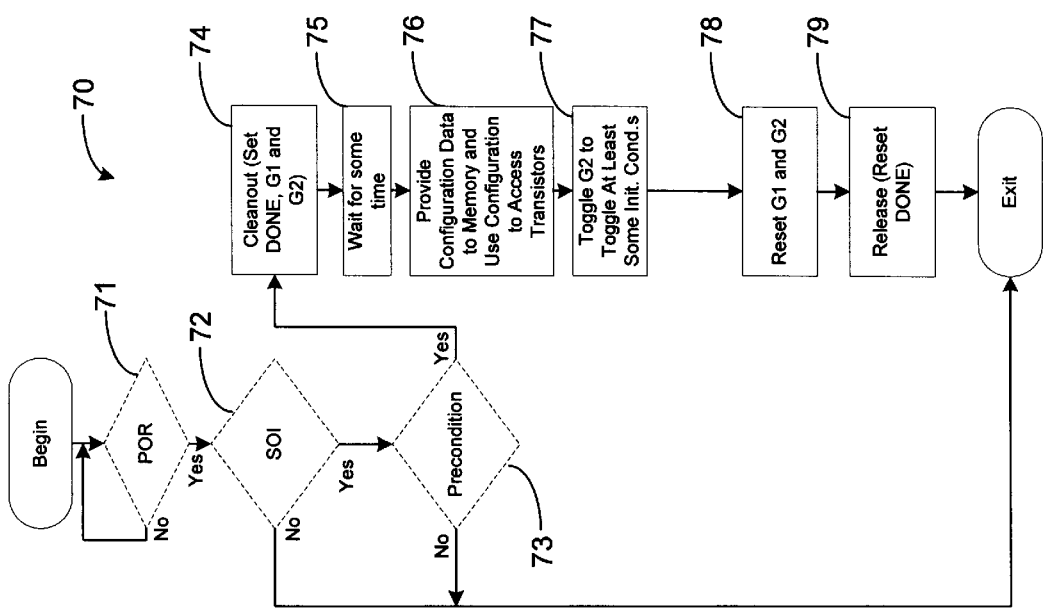
FIG. 7 is a flow diagram depicting an exemplary embodiment of a transistor conditioning routine in accordance with an aspect of the present invention.

FIG. 7 is a flow diagram depicting an exemplary embodiment of a transistor preconditioning routine 70 in accordance with an aspect of the present invention. At optional step 71, a determination is made as to whether Power On Reset (POR) has occurred. If a POR event has not occurred, then routine 70 continues monitoring for a POR event.

If a POR event has occurred, then at optional step 72 a determination is made as to whether this PLD, is a semiconductor-on-insulator device, or more particularly an SOI device. By way of example and not limitation, a device identifier, conventionally hard coded in such a PLD, may be used to determine if this device is an SOI device or in a family of SOI devices. For example, if such a device is not an SOI device, then routine 70 may exit, and if such a device is an SOI device, then routine 70 may proceed.

At optional step 73, a user of a PLD determines if they would like to precondition. If such a user decides not to precondition, then routine 70 may exit. If such a user decides to precondition, then routine 70 continues at step 74. More particularly, a circuit designer may specify that only speed critical logic nodes or transistors need preconditioning and identify which speed critical logic nodes or transistors need preconditioning.

Steps 74 through 79 show an exemplary embodiment of a process for preconditioning an FPGA in accordance with an aspect of the present invention. At step 74, a cleanout operation is performed. A cleanout operation sets an FPGA's initial conditions. Conventionally, initial conditions are set to desired target logic or voltage levels to avoid unwanted currents.

In order to put an FPGA into and out of a customer mode, a DONE signal may be used. In FIG. 1, a DONE signal is illustratively shown as an external signal; however, conventional FPGAs use an internally generated DONE signal to indicate completion of a configuration operation, and this internal signal may be used to put an FPGA into and out of a customer mode instead of using an external DONE signal.

At step 74, a DONE signal is set to inactive indicating completion of configuration of an FPGAA cleanout set signal, for example G1, is set to active, and a precondition set signal, for example G2, may be set to active, or may not be set, as in a don't care condition. For example in FIG. 3, for a cleanout operation both G1 and G2 are set to active, and G1 may be held active throughout cleanout and preconditioning.

At optional step 75, a forced pause of approximately one to 1000 microseconds may be used to allow for signal propagation. This optional step 75 may be used to ensure a cleanout operation has completed before proceeding to step 76.

At step 76, configuration data is loaded into configuration memory to configure FPGA memory cells. This configuration data may include a duty cycle for toggling a preconditioning signal, for example G2, which duty cycle may be user programmable. By writing configuration data to memory, logic nodes or transistors to be employed in such configuration have been identified for preconditioning, as is explained in more detail below.

At step 77, a precondition set signal may be set to active, if not already done so at step 74. A preconditioning signal, which may be the same signal as a precondition set signal such as for example G2, may be toggled. This toggling may take place for a predetermined number or user programmed number of on-off transistor switching cycles. Such a preconditioning signal is applied to logic nodes or transistors identified from configuration data.

Accordingly, it should be appreciated that because memory cells of an FPGA are configured, a circuit design is effectively loaded. Thus, interconnects are programmed, gates are configured, flip-flops are configured, global clock buses are configured, and all other circuit elements in the circuit design are configured.

Because an FPGA may contain many millions of transistors, only a portion of which are used in a deployed circuit design, by preconditioning based on a user's FPGA design, only a subset of all FPGA transistors, namely those used in the deployed circuit design, are accessible for preconditioning. Thus, preconditioning a configured FPGA, as opposed to a non-configured FPGA, is advantageous because at most only a subset of transistors are preconditioned. This advantageously speeds up preconditioning and advantageously reduces power consumption for preconditioning as fewer transistors are accessed than if an entire FPGA was preconditioned. More particularly, if a circuit designer identifies that only certain switch speed critical transistors need preconditioning, then only those transistors are targeted for preconditioning. If no such limitation is imposed by a circuit design, then by toggling a globally applied signal, all transistor elements of a deployed design may be preconditioned. Furthermore, except for those transistors infrequently accessed, after preconditioning, a sufficient amount of charge will stay on an SOI transistor floating body portion for a sufficient time owing to subsequent switching operations. Accordingly, for most transistors, initial preconditioning will be sufficient. However, as mentioned above, additional circuits may be included in the configuration data for in-use conditioning.

At step 78, precondition set signal and cleanout set signal are set inactive.

At step 79, DONE is set active to place the PLD into customer mode.

Figure 8:
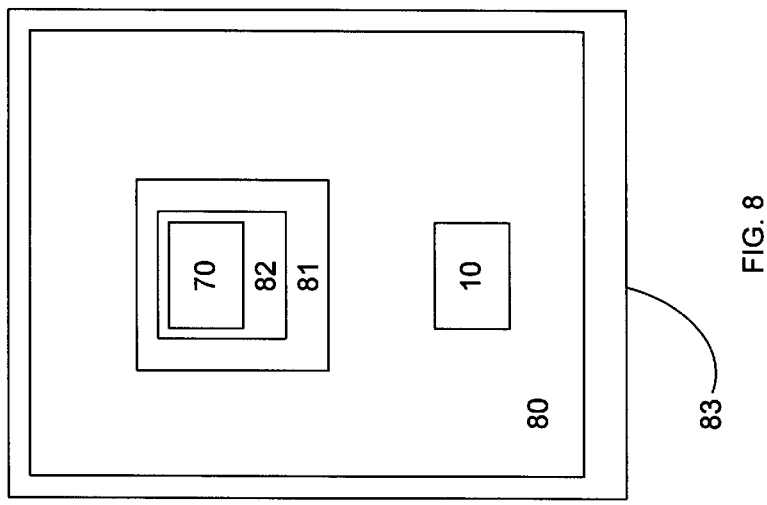
FIG. 8 is a block diagram depicting an exemplary embodiment of a signal-bearing media comprising at least a portion of the routine of FIG. 7 in accordance with an aspect of the present invention.

FIG. 8 is a block diagram depicting an exemplary embodiment of a signal bearing media 82 containing at least a portion of routine 70 of FIG. 7 in accordance with an aspect of the present invention. FPGA 10 may be attached to a circuit board 80 for operative coupling to signal bearing media 82. Circuit board 80 may be disposed in a computer, a router, or any other programmable device 83 employing circuit boards with at least one FPGA. Signal-bearing media 82 may be operatively coupled to FPGA 10 via circuit board 80 and signal-bearing media drive 81; alternatively, signal-bearing media drive 81 may be omitted when signal-bearing media 82 is directly readable such as electronically readable integrated circuit memory, including but not limited to DRAM, SRAM, EEPROM, flash, and the like. Accordingly, by execution of at least a portion of a process portion of routine 70, a preconditioned FPGA 10 is provided.

At least a portion of routine 70 for providing a program product defines functions of one or more aspects of the present invention and can be contained on a variety of signal-bearing media 82, which include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive) or (iii) information conveyed to a computer by a communications medium, such as through a computer or telephone network, including wireless communications. The latter embodiment specifically includes information downloaded from the Internet and other networks. Such signal-bearing media 82, when carrying computer-readable instructions that direct the functions of the present invention, represent embodiments of the present invention.

Although various embodiments which incorporate the teachings of the present invention have been shown and described in detail herein, those skilled in the art can readily devise many other varied embodiments that still incorporate these teachings. For example, one or more aspects of the present invention may be implemented in PLDs other than FPGAs. Such other devices include without limitation CPLDs and the like.

Xilinx is a trademark of Xilinx, Inc. All other trademarks are the property of their respective owners.

What is claimed is:

1. A method for preconditioning at least one transistor in a programmable logic device formed on a semiconductor-on-insulator structure, the method comprising:

loading configuration data into the programmable logic device;

configuring the programmable logic device in response to the configuration data, the at least one transistor identified by the configuring of the programmable logic device; and switching the at least one transistor between on and off states;

wherein the switching conditions the at least one transistor by an accumulation of charge.

2. The method of claim 1 wherein the configuration data is loaded into memory cells of the programmable logic devices.

3. The method of claim 2 wherein the semiconductor-on-insulator structure is a silicon-on-insulator structure.

4. The method of claim 2 wherein the programmable logic device is a field programmable gate array.

5. A method for a field programmable gate array having transistors formed with a silicon-on-insulator structure, the method comprising:

loading configuration data into the field programmable gate array;

configuring memory cells of the field programmable gate array in response to the configuration data, the transistors being selected in response to the configuration data; and toggling at least a portion of the transistors between states to accumulate charge in a portion of the silicon-on-insulator structure to condition the at least a portion of the transistors.

6. The method of claim 5 further comprising setting the field programmable gate array to an initial condition.

7. The method of claim 6 further comprising after the toggling, resetting the field programmable gate array to the initial condition.

8. The method of claim 6 further comprising waiting for a determined amount of time to pass between the setting of the field programmable gate array and the configuring of the memory cells.

9. The method of claim 6 further comprising waiting for a determined amount of time to pass between the setting of the field programmable gate array and the loading of the configuration data.

10. A method for conditioning a field programmable gate array (FPGA), comprising:

performing a first cleanout operation on the FPGA;

configuring the FPGA with configuration data; and toggling transistors in the FPGA between two states to bias the transistors to increase switching speed.

11. The method of claim 10 further comprising performing a second cleanout operation on the FPGA.

12. The method of claim 10 wherein the transistors comprise at least a portion of programmable intersection points (PIPs) of the FPGA.

13. The method of claim 10 wherein the transistors comprise at least a portion of configuration logic blocks (CLBs) of the FPGA.

14. The method of claim 10 wherein the transistors comprise at least a portion of interconnect network buffers of the FPGA.

15. The method of claim 10 wherein the transistors are formed at least in part on a silicon-on-insulator structure.

16. A signal-bearing media containing a program which, when executed by a programmable device, preconditions a field programmable gate array (FPGA) programmed with configuration information, the program when executed causes execution of a method comprising:

toggling a plurality of transistors in the FPGA between two states to bias the plurality of transistors; and cleaning out the FPGA.

17. The method of claim 16 further comprising providing a predetermined number or user programmed number of times to toggle the plurality of transistors.

18. The method of claim 16 wherein the signal-bearing media comprises an array of memory cells external to and operatively coupled to the FPGA.

19. An assembly comprising:

a circuit board;

a field programmable gate array (FPGA) attached to and in electrical communication with the circuit board, the FPGA having a memory including an array of memory cells, the memory having stored therein configuration data;

a signal-bearing media operatively coupled to the FPGA at least in part via the circuit board, the signal bearing media programmed with a routine for preconditioning the FPGA, the routine when executed causes execution of a method comprising:

toggling at least a portion of a plurality of transistors associated with the configuration data between states to accumulate charge in a silicon-on-insulator structure associated with the portion of the plurality of transistors.

20. The assembly of claim 19 wherein the routine further comprises determining whether to invoke the method.

21. The assembly of claim 20 wherein the routine further comprises determining whether the FPGA includes the silicon-on-insulator structure.

22. A field programmable logic array (FPGA) formed at least in part on a silicon-on-insulator structure, the FPGA comprising:

a plurality of pads;

a plurality of input logic blocks in electrical communication with a first portion of the pads, the input logic blocks configured to receive a bitstream, the bitstream representing configuration data to configure the FPGA;

a memory having an array of memory cells, the memory in electrical communication with the input logic blocks configured to receive the bitstream and to configure at least a portion of the array of memory cells in response to the bitstream;

an interconnect network in electrical communication with the memory and the input logic blocks, the interconnect network having a plurality of programmable interconnection points, a plurality of interconnection lines and a plurality of buffers in-line with the interconnection lines;

an array of configuration logic blocks programmably connectable to the input logic blocks;

a plurality of output logic blocks programmably connectable to the array of configuration logic blocks, the plurality of output logic blocks coupled to a second portion of the pads; and the FPGA preconditioned by execution of a program, which when executed causes transistors associated with a configuration of the FPGA to be toggled between states.

23. The FPGA of claim 22 wherein execution of the program further comprises:

providing a cleanout set signal; and providing a precondition set signal.

24. The FPGA of claim 23 wherein the precondition set signal is toggled for preconditioning.

25. The FPGA of claim 24 wherein an pad of the plurality of pads is configured to receive a customer mode select signal.

26. A field programmable logic array (FPGA) formed at least in part on a silicon-on-insulator structure, the FPGA comprising:

a plurality of pads;

a plurality of input logic blocks in electrical communication with a first portion of the plurality of pads;

an interconnect network in electrical communication with the memory and the input logic blocks, the interconnect network having a plurality of programmable interconnection points;

an array of configuration logic blocks programmably connectable to the input logic blocks, the array of configuration logic blocks configured to load a bitstream;

a memory having an array of memory cells, the memory in electrical communication with the configuration logic blocks configured to load the bitstream into the memory and to configure at least a portion of the array of memory cells in response to the bitstream;

the interconnect network comprising direct paths for connecting configuration logic blocks of the array of configuration logic blocks to one another without buffering;

at least one of the direct paths in electrical communication with a circuit configured to precondition identified logic nodes of the FPGA; and a plurality of output logic blocks programmably connectable to the array of configuration logic blocks, the plurality of output logic blocks operatively coupled to a second portion of the plurality of pads.

27. The FPGA of claim 26 wherein the circuit comprises a mode select signal configured to be toggled to precondition the identified logic nodes.

28. A pre-configuration process, comprising:

providing a circuit design for an implementation using an FPGA formed using an SOI structure; and adding at least one conditioning circuit to the circuit design to in-use condition at least one transistor.

29. A field programmable gate array, comprising:

a first configuration logic block, the configuration logic block comprising a first conditioning circuit portion, the first conditioning circuit portion providing a first output selected from an in-phase toggling signal and an out-of-phase toggling signal with respect to a reference toggling signal;

an interconnect network portion operatively coupled to the first configuration block portion to receive the first output; and a second configuration logic block portion operatively coupled to the interconnect network portion to receive the first output and to provide a second output in response thereto.

* * * * *

UNITED STATES PATENT AND TRADEMARK OFFICE
CERTIFICATE OF CORRECTION

PATENT NO. : 6,369,608 B1  
APPLICATION NO. : 09/765683  
DATED : April 9, 2002  
INVENTOR(S) : Austin H. Lesea et al.

Page 1 of 1

It is certified that error appears in the above-identified patent and that said Letters Patent is hereby corrected as shown below:

On the title page, item [73] Assignee "Xillinx, Inc., SanJose, CA (US)" should read
-- Xilinx, Inc., San Jose, CA (US) --.

Signed and Sealed this
Tenth Day of April, 2012

David J. Kappos
*Director of the United States Patent and Trademark Office*